United States Patent [19]

Kobayashi et al.

[11] Patent Number: 5,003,479

[45] Date of Patent: Mar. 26, 1991

[54] DIAGNOSIS SYSTEM FOR A MOTOR VEHICLE

[75] Inventors: Tomoya Kobayashi; Kunihiro Abe; Masanori Sakamoto, all of Tokyo, Japan

[73] Assignee: Fuji Jukogyo Kabushiki Kaisha, Tokyo, Japan

[21] Appl. No.: 306,884

[22] Filed: Feb. 2, 1989

[30] Foreign Application Priority Data

Feb. 18, 1988 [JP] Japan .................. 63-036423

[51] Int. Cl.$^5$ ..................... G01M 15/00; F02D 41/26; F02P 17/00
[52] U.S. Cl. .............. 364/424.03; 73/117.2; 364/431.01; 364/551.01
[58] Field of Search ............. 73/117.3, 116, 117.2, 73/119 R, 119 A; 364/431.01, 551.01

[56] References Cited

U.S. PATENT DOCUMENTS

| | | | |
|---|---|---|---|
| 4,398,259 | 8/1983 | Levine | 364/431.01 |
| 4,404,639 | 9/1983 | McGuire et al. | 73/117.3 |
| 4,527,424 | 7/1985 | Takahashi | 73/119 A |
| 4,694,408 | 9/1987 | Zaleski | 364/551.01 |
| 4,748,843 | 6/1988 | Schäfer et al. | 73/117.3 |
| 4,757,463 | 7/1988 | Ballou et al. | 364/551.01 |
| 4,926,330 | 5/1990 | Abe et al. | 364/424.03 |

FOREIGN PATENT DOCUMENTS

58-12848 1/1983 Japan .
59-61740 4/1984 Japan .

Primary Examiner—Felix D. Gruber
Attorney, Agent, or Firm—Martin A. Farber

[57] ABSTRACT

A system for diagnosing a motor vehicle has a diagnosis device including a computer having a central processing unit and a RAM and ROM. The ROM stores a plurality of programs for diagnosing an electronic control system for controlling an engine. The ROM stores data for displaying abbreviations of an input diagnosis mode. Data for an abbreviation is derived from the ROM in accordance with the input diagnosis mode and the abbreviation is displayed on a display in accordance with the data.

4 Claims, 7 Drawing Sheets

| REGISTER | ABBREVIATION | UNITS |
|---|---|---|
| F01 | VB | V |
| F02 | VSP | m/h |
| F03 | VSP | km/h |
| F04 | EREV | r.p.m |
| F05 | EREV | r.p.m |
| F06 | TW | deg F |
| F07 | TW | deg C |
| F08 | ADVS | deg |

FIG. 5b

REGISTER → | VB | F01 | 11.76 | V |

- VB: ABBREVIATION OF CHECK ITEM
- F01: MODE CODE
- 11.76: NUMERICAL VALUE
- V: UNITS

FIG. 6

DIAGNOSIS SYSTEM FOR A MOTOR VEHICLE

BACKGROUND OF THE INVENTION

The present invention relates to a diagnosis system for a motor vehicle.

Recently, a motor vehicle has been equipped with an electronic control system for controlling various components of an engine, such as fuel injectors, thereby improving driveability, exhaust gas emission, fuel consumption and engine power. The electronic control system controls the components based on information represented by output signals from various sensors for detecting engine operating conditions. Accordingly, if malfunctions of components and sensors occur, the engine does not properly operate.

However, because of the complexity of the electronic control system, it is difficult to immediately find out the trouble. Accordingly, a trouble diagnosis device for easily checking the electronic control system should be equipped in an auto shop.

Japanese Patent Application Laid Open 59-61740 discloses a self-diagnosis system where signaling lamps provided on the vehicle are lit or flashed when abnormalities occur in sensors and actuators such as injectors. However, the actual conditions of the defective sensors and actuators cannot be represented by the lamps.

Japanese Patent Application Laid-Open 58-12848 discloses a diagnosis system in which an exclusive checking device is provided for measuring the pulse duration of the fuel injection and an engine speed, and for checking whether idling speed is normal. The checking device is provided for diagnosing only designated specific types of motor vehicles.

Figure 6:
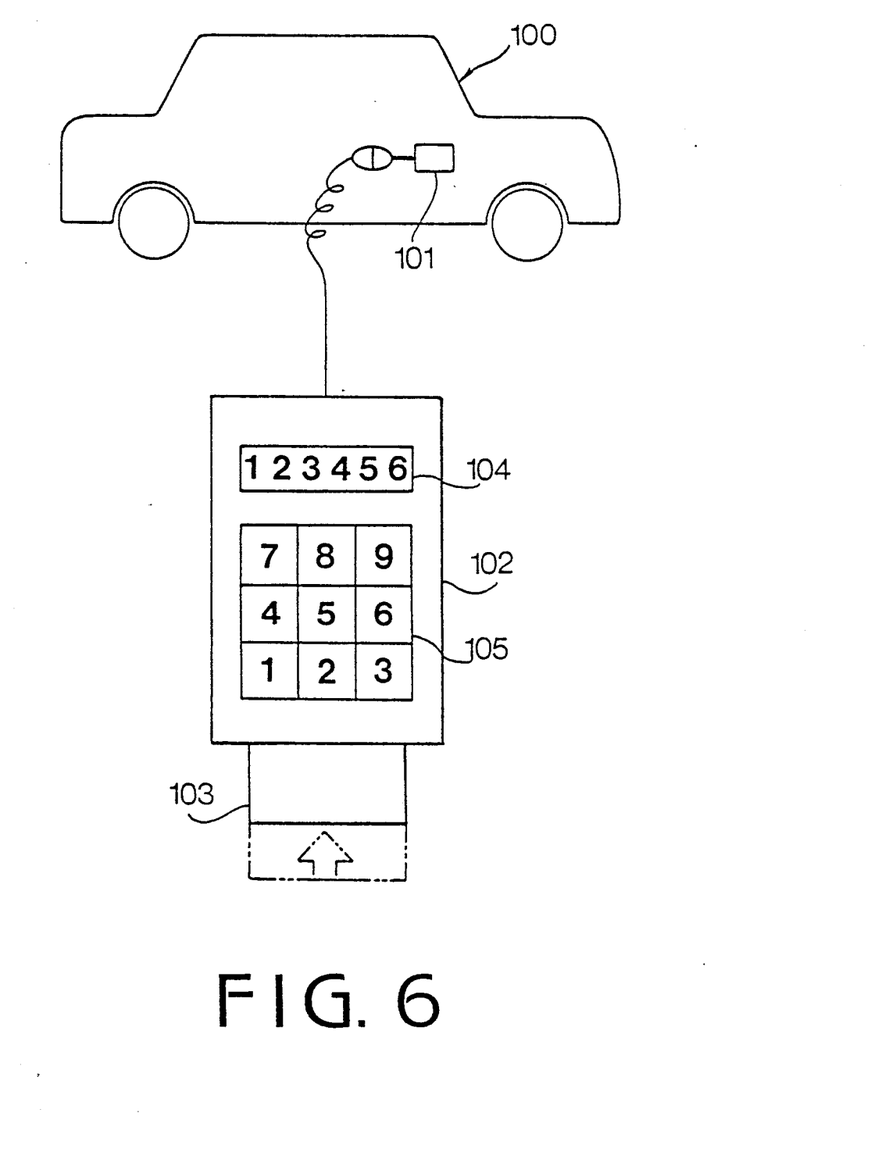
FIG. 6 is a schematic illustration of a conventional diagnosis system.

FIG. 6 shows a recently proposed a diagnosis system which comprises a diagnosis device 102 and a memory cartridge 103 detachably attached to the device 102. The memory cartridge 103 has a memory such as a ROM for storing diagnosis programs and fixed data for the type and the model year of the vehicle 100. Various cartridges 103 for different vehicle types are provided and a cartridge for the presented vehicle is selected and attached to the diagnosis device 102. A two-way communication between the cartridge 103 and an electronic control system 101 on the vehicle 100 is performed for diagnosing the electronic control system. Diagnosis results of sensors are indicated on a display 104 by operating a keyboard 105 on the diagnosis device 102. However, only the numerical value of the result is shown on the display 104 and the name or abbreviation of the component which is being diagnosed is not displayed. Therefore, the diagnostician must keep in mind the selected diagnosis mode or the item of the checking while consulting an operation manual. Thus, the diagnostician cannot concentrate on the diagnosis.

SUMMARY OF THE INVENTION

The object of the present invention is to provide a diagnosis system wherein diagnosis data indicated on a display can be easily identified without looking in a manual.

According to the present invention, there is provided a system for diagnosing an automotive engine mounted on a vehicle, comprising a diagnosis device including a computer having a control unit and a volatile memory, non-volatile memory, the non-volatile memory having a plurality of programs for diagnosing the electronic control system, and display means for displaying result of diagnosis, connecting means connecting the computer to the electronic control system, input means for inputting a mode code of a diagnosis mode to the volatile memory, the non-volatile memory storing data for displaying abbreviations of an input mode code of a diagnosis mode, retrieval means for retrieving a data for an abbreviation from the non-volatile memory in accordance with the input mode code of a diagnosis mode and for storing the data, and displaying the abbreviation on the display means in accordance with the retrieved data.

The other objects and features of this invention will become understood from the following description with reference to the accompanying drawings.

DETAILED DESCRIPTION OF THE PREFERRED EMBODIMENT

Figure 1:
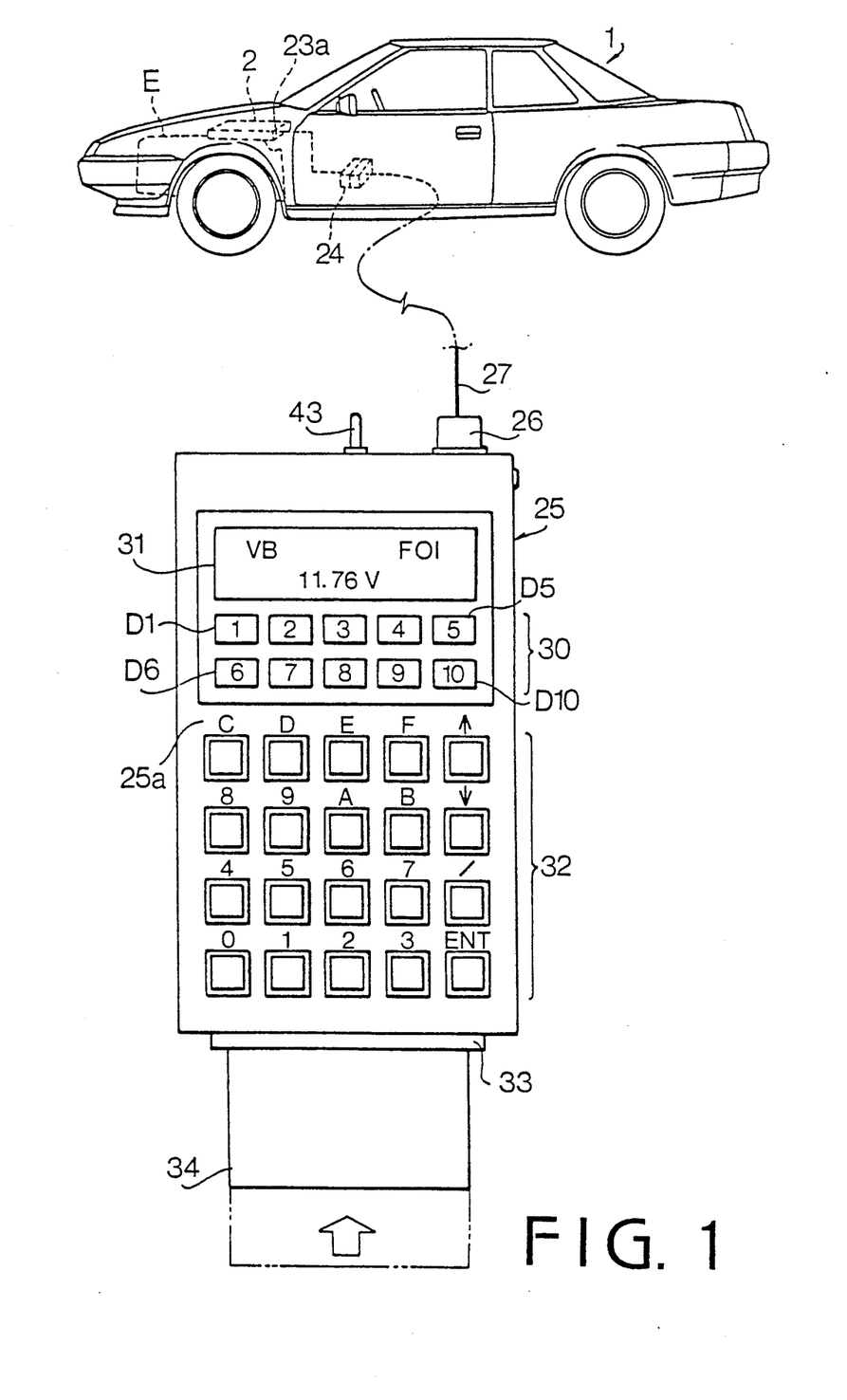
FIG. 1 is a schematic illustration of a diagnosis system according to the present invention.

Referring to FIG. 1, an automobile 1 is equipped with an electronic control system 2 for controlling various components of an engine E. The electronic control system 2 is connected to an external connector 24. A portable diagnosis device 25 comprising a microcomputer is housed in a case 25a and has a connector 26, to which the connector 24 of the system 2 is connected through an adapter harness 27.

The diagnosis device 25 has a power switch 43, a liquid crystal display 31, an indicator section 30 consisting of a plurality of LED indicators, and a keyboard 32. A connector 33 is provided for connecting a detachable memory cartridge 34.

Figure 2A:
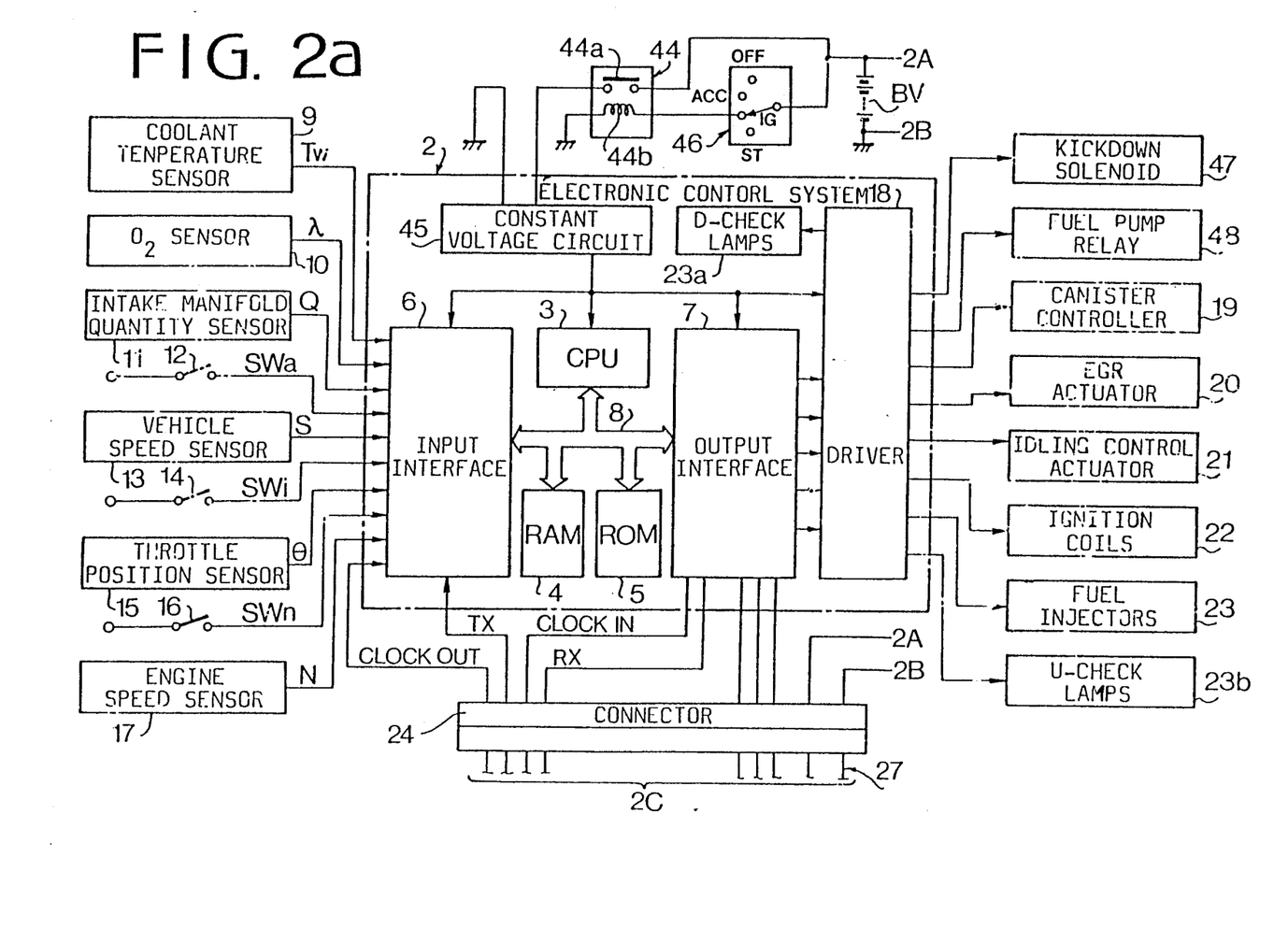
FIGS. 2a and 2b show a block diagram of the system.
Figure 2B:
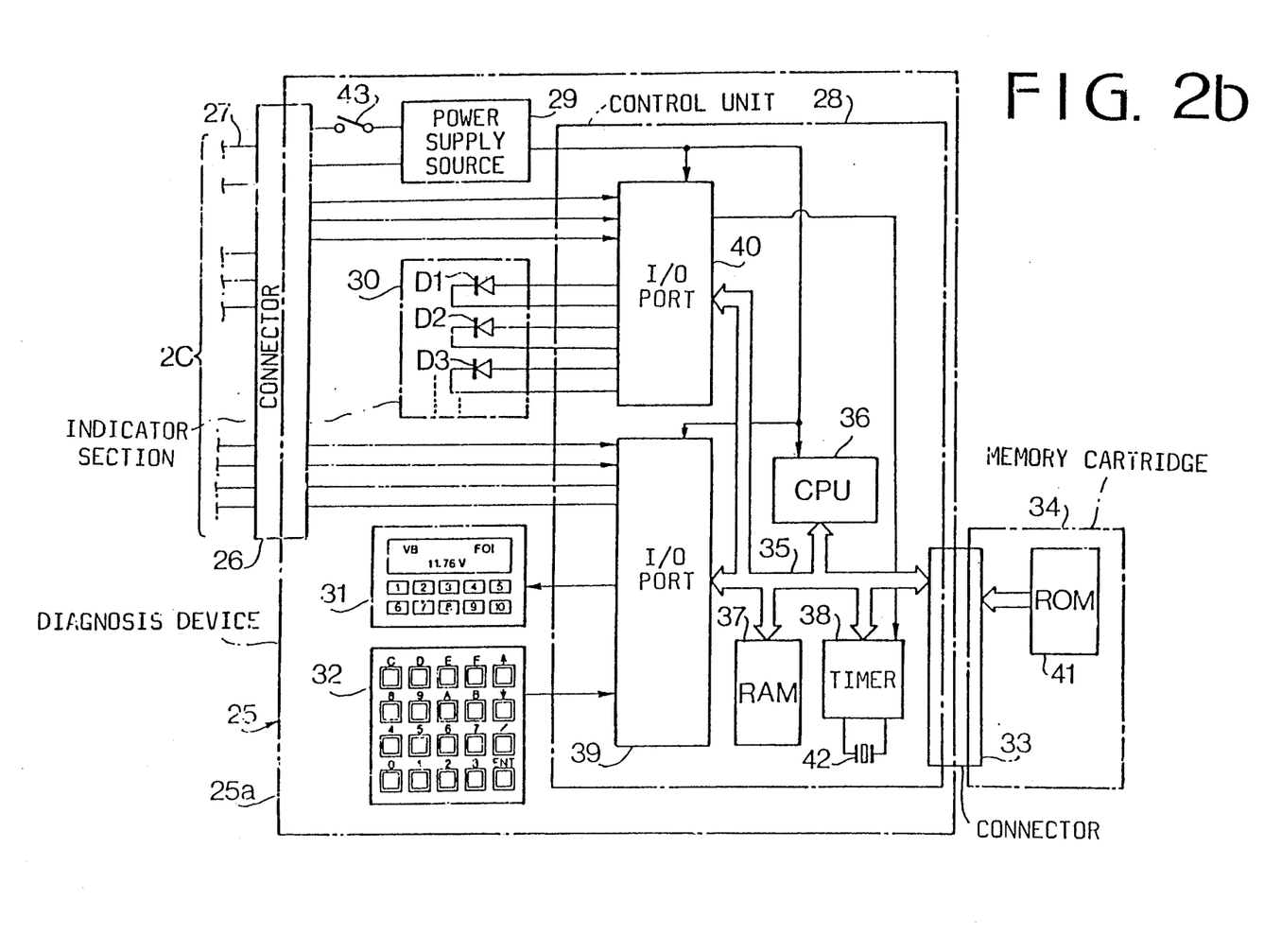

Referring to FIGS. 2a and 2b, the electronic control system 2 comprises a central processor unit (CPU) 3, a random access memory (RAM) 4 as a volatile memory, a read only memory (ROM) 5 as a non-volatile memory, an input interface 6 and an output interface 7. The CPU 3, RAM 4, ROM 5, input and output interfaces 6 and 7 are connected to each other through a bus line 8. Programs and data for controlling the engine and fixed data such as the type of the vehicle are stored in the ROM 5. Power is supplied to the CPU 3, input and output interfaces 6 and 7, and a driver 18 from a source BV through a contact 44a of a power relay 44 and a constant voltage circuit 45. A relay coil 44b of the relay 44 is connected to the source BV through an ignition terminal IG of an ignition switch 46.

The input interface 6 is applied with a coolant temperature signal Tw from a coolant temperature sensor 9, an air-fuel ratio feedback signal λ from an O₂ sensor 10, an intake-air quantity signal Q from an intake manifold quantity sensor 11, an air conditioner operating signal SWa from an air conditioner switch 12, a vehicle speed signal S from a vehicle speed sensor 13, an idling signal SWi from an idle switch 14, a throttle valve opening degree signal Θ from a throttle position sensor 15, a neutral positioning signal SWn from a neutral switch 16 in a transmission, and an engine speed signal N from an engine speed sensor 17. These signals are stored in the RAM 4 after processing data in accordance with the program stored in the ROM 5. The CPU 3 produces respective control signals, which are applied to the driver 18 through the output interface 7. The driver 18 produces signals for controlling a kickdown solenoid 47 of a kickdown switch, a fuel pump relay 48, a canister controller 19 of a fuel-vapor emission control system, an EGR (exhaust gas recirculation system) actuator 20, an idling control actuator 21, ignition coils 22 and fuel injectors 23.

The driver 18 further applies signals to D-check lamps 23a and U-check lamps 23b. The D-check lamps 23a are provided in the electronic control system 2 for informing of an abnormality in the system 2. When an abnormality is detected in the system 2 by a self-diagnosis function, a corresponding trouble code is read out from the ROM 5 so as to turn on or flash a plurality of lamps 23a, thereby indicating the trouble code. The U-check lamps 23b are provided on a dashboard of the vehicle so as to warn the driver of the trouble detected by the self-diagnosis function.

The diagnosis device 25 has a control unit 28 and a power supply source 29. The control unit 28 comprises a CPU 36, a RAM 37, input/output (I/O) ports 39 and 40 and a timer 38. These elements are connected to each other through a bus line 35. A clock pulse generator 42 is provided for generating synchronizing pulses. A ROM 41 provided in the memory cartridge 34 is connected to the bus line 35 through the connector 33. The ROM 41 stores a plurality of programs for diagnosing various troubles of the control system 2 and fixed data, which will later be described in detail. Inputs of the I/O port 40 are connected to the output interface 7 of the control system 2 through connectors 24 and 26 and harness 27 so as to receive output signals of the sensors and switches 9 to 17. Outputs of the port 40 are connected to the indicator section 30. Inputs of the I/O port 39 are connected to the keyboard 32 for being applied with a mode select signal dependent on the operation of the keyboard, and to the output interface 7. Outputs of the port 39 are connected to the input interface 6 and the display 31. The power source 29 for supplying the power to the CPU 36 and I/O ports 39 and 40 is connected to the source BV through the power switch 43.

Figure 5A:
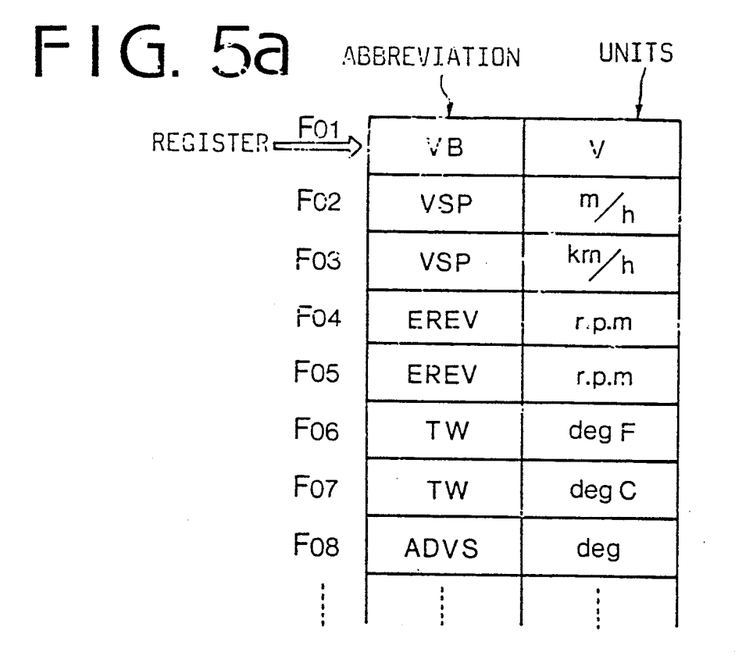
FIG. 5a is a diagram showing a table storing abbreviations and units.

The ROM 41 stores, as fixed data, a plurality of data representing abbreviations of check items and units in a form of a table and diagnosing programs for the specific type of the vehicle. FIG. 5a shows abbreviations of check items. For example, data for displaying an abbreviation VB and units V for a diagnosis mode checking of the battery voltage are stored.

Figure 3:
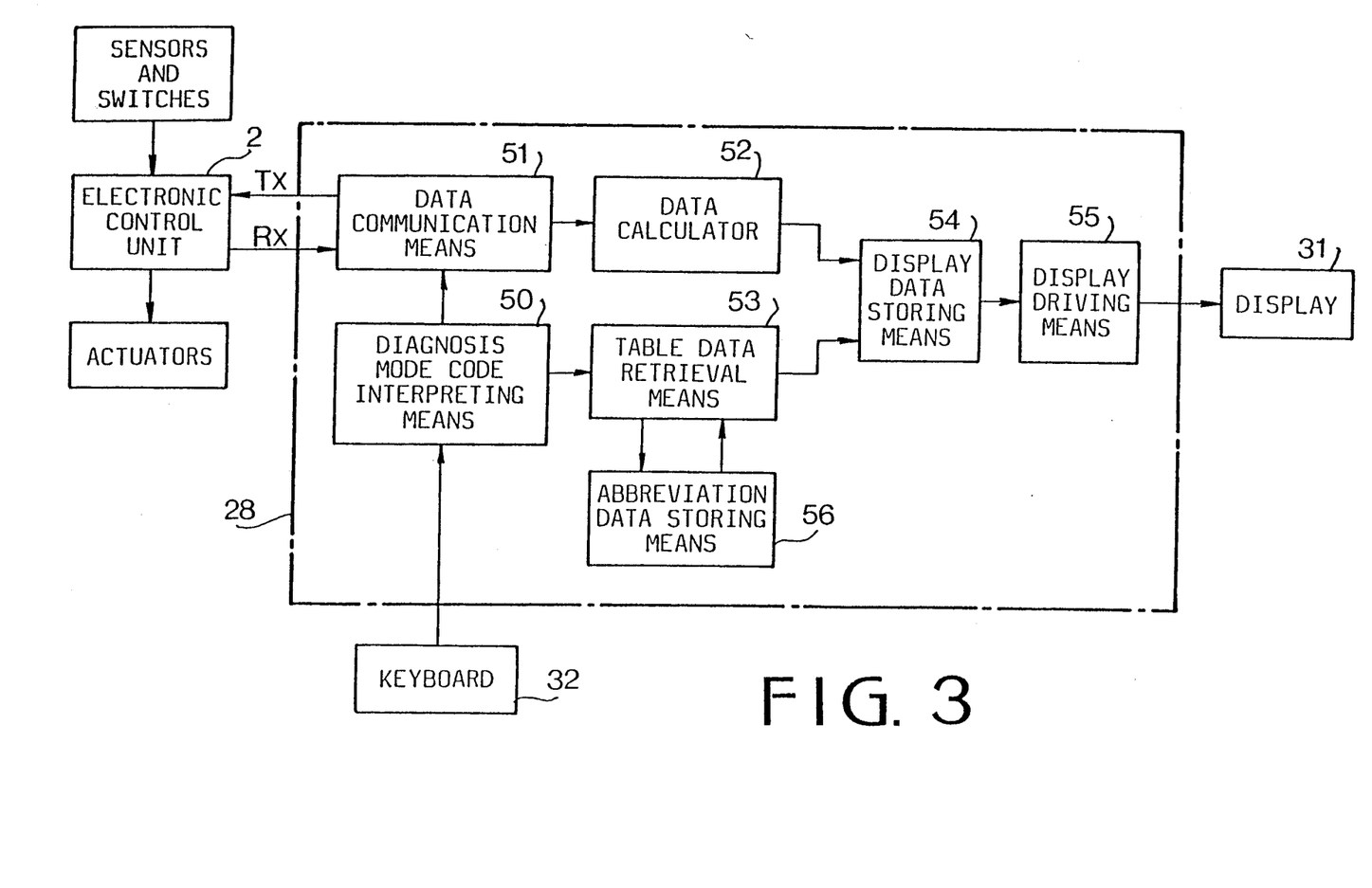
FIG. 3 is a block diagram showing a main part of the system.

The control unit 28 is described in more in detail with reference to FIG. 3. The control unit 28 is provided with a diagnosis mode code interpreting means 50 which produces a mode signal in dependency on a mode code of a diagnosis mode input by operating the keyboard 32. The mode signal is applied to a table data retrieval means 53 which addresses an abbreviation data storing means 56 to derive abbreviations. The mode signal is further applied to a data communication system 51 which sends a data demand signal TX to the control system 2 in accordance with the item signal. A data signal RX representing information on sensors or switches is applied from the control system 2 to a data calculator 52 through the data communication system 51 in accordance with data demand signal TX. The data signal in the form of binary digits is converted into a decimal digit by the calculator 52.

Figure 5B:
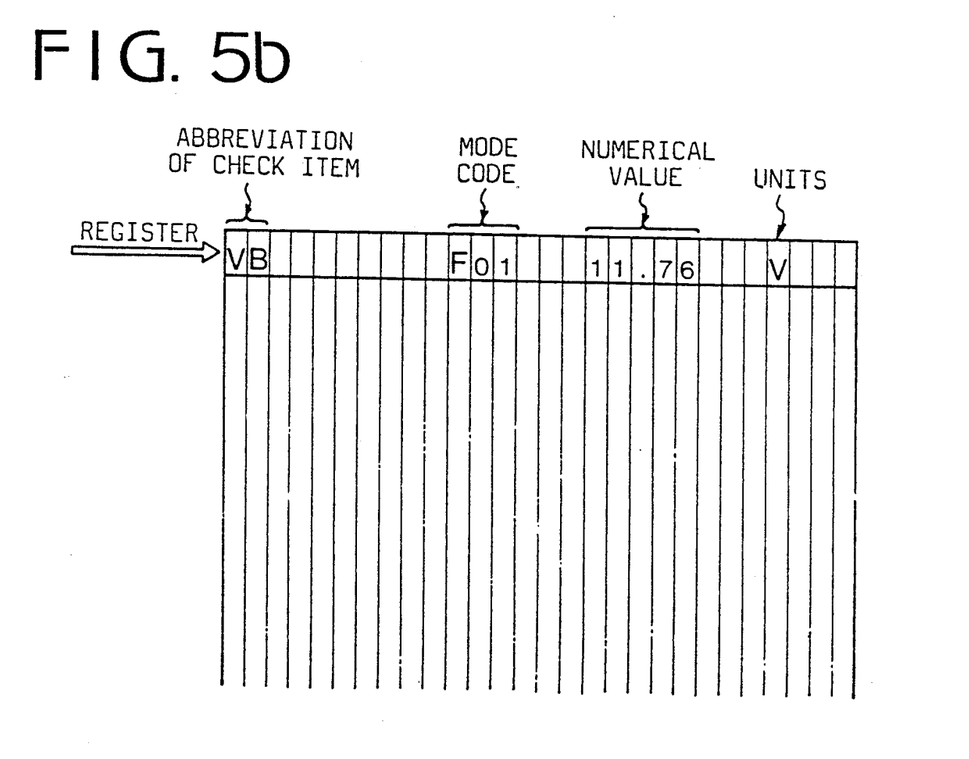
FIG. 5b is a diagram showing a memory map storing display data.

Output signals of the retrieval means 53 and the data calculator 52 are applied to a display data storing means 54 to store the abbreviation data and the diagnosis data in a memory map provided in the RAM 37 as shown in FIG. 5b. An output signal of the display data storing means 54 is applied to a display driving means 55 which applies driving signals to the display 31 so as to indicate the diagnosis and abbreviation data.

Before performing the diagnosis program, the control system 2 is connected to the diagnosis device 25 through the harness 27 and cartridge 34 is attached to the diagnosis device 25.

Figure 4:
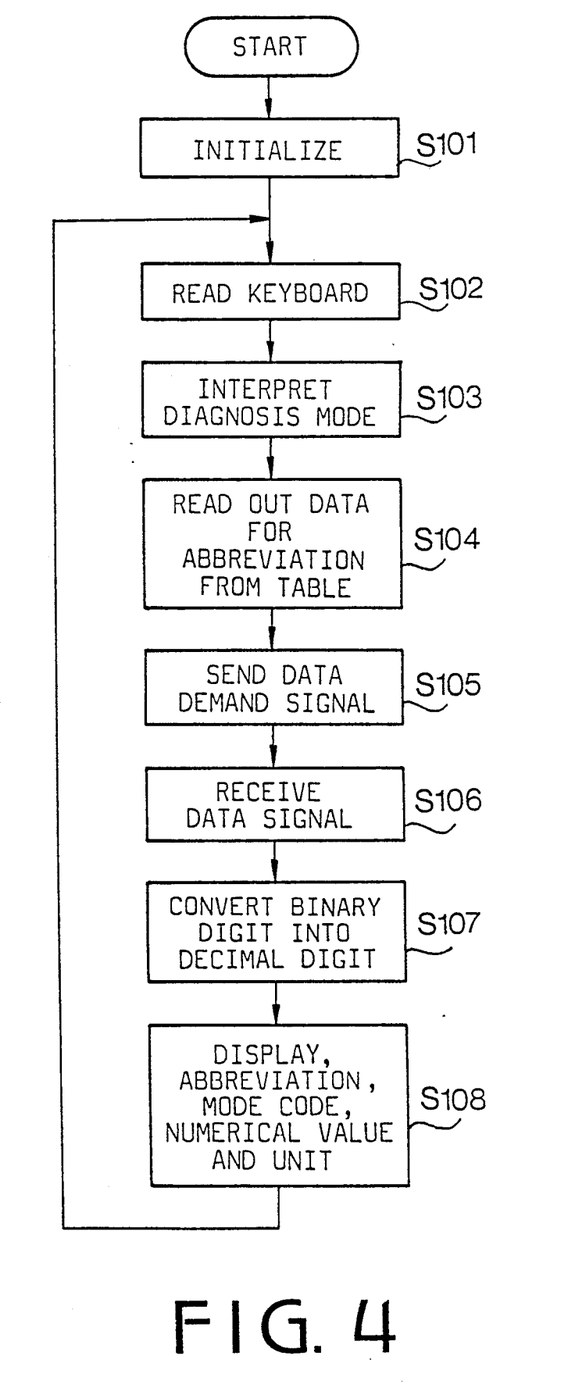
FIG. 4 is a flowchart showing an operation of the system.

The operation of the system is described hereinafter with reference to the flowchart of FIG. 4. The engine is started, and the following diagnosis program is performed under the running condition of the engine.

The power switch 43 is turned on and initialization of the control unit 28 is performed at a step S101. A diagnostician selects a diagnosis mode and and operates the keyboard 32 to input a mode code of the diagnosis mode. For example, when checking battery voltage, a mode code F01 for the battery voltage checking item (for example F→0→1→ENT) is input by operating the keyboard 32. The mode code is temporarily stored at a predetermined address in the memory map of RAM 37. At steps S102 and S103, the mode code is read out and interpreted by the mode code interpreting means 50. At a step S104, the data for an abbreviation of the check item and its units are read out from the ROM 41 by the data retrieval means 53 in accordance with the selected mode, and stored in the RAM 37. In the battery voltage checking mode, data for displaying the abbreviation VB for the battery voltage and the units V (representing voltage) is read out and stored.

The data demand signal TX depending on the selected mode is applied to the control system 2 at a step S105. At a step S106, a diagnosis data signal RX representing the battery voltage is applied to the control unit 28 from the control system 2. At a step S107, the received binary digit is converted into a decimal digit representing the battery voltage, and stored in the RAM 37. At a step S108, the abbreviation of the battery voltage and the unit stored at steps S102 and S104 and the diagnosis data in decimal digit stored at the step S107 are read out and applied to the display driving means 55. Accordingly, the abbreviation VB, the mode code F01, battery voltage 11.76 and the unit V of the voltage are displayed on the display 31 as shown in FIG. 1. Thus, the diagnostician can easily diagnose the item about the battery voltage. The program returns to the step S102 for the next diagnosis.

Outputs of various sensors can be checked by selecting other diagnosis modes shown in FIG. 5a in a similar manner to the above described manner. Each mode code represents a diagnosis mode as indicated below.

| Diagnosis mode code | Check item | Abbreviation | Unit |
|---|---|---|---|
| F02 | Vehicle Speed | VSP | m(miles)/h |
| F03 | Vehicle Speed | VSP | km/h |
| F04 | Engine Speed | EREV | rpm |
| F05 | Engine Speed | EREV | rpm |
| F06 | Coolant Temperature | TW | degree |

| Diagnosis mode code | Check item | Abbreviation | Unit |
|---|---|---|---|
| | | | -continued |
| F07 | Coolant Temperature | TW | (Fahrenheit) degree (Centigrade) |
| F08 | Ignition Timing | ADVS | degree |

From the foregoing, it will be understood that the present invention provides a diagnosis system where diagnosis data shown on the display can be easily identified without consulting a manual. Since the data is simply displayed, the operability is improved, thereby enabling a diagnostician to be occupied with the diagnosis.

While the presenting preferred embodiment of the present invention has been shown and described, it is to be understood that this disclosure is for the purpose of illustration and that various changes and modifications may be made without departing from the scope of the invention as set forth in the appended claims.

What is claimed is:

1. A diagnosis system for diagnosing an electronic control system mounted on a vehicle, the electronic control system having sensing means for providing output data representing operating conditions of the vehicle and control means responsive to said output data for providing control data to control the vehicle, the diagnosis system having a diagnosis device with connecting means for transmitting signals between said electronic control system and said diagnosis device, a keyboard for inputting a mode code to designate one of said data in said electronic control system as designated data, and display means for displaying said designated data, the diagnosis device including a programmed computer comprising:

interpreting means responsive to said mode code for interpreting said mode code for the designated data and for providing a corresponding mode signal;

retrieving means responsive to said mode signal of said interpreting means for retrieving at least one of an abbreviation and units corresponding to said designated data; and communication means responsive to said mode signal of said interpreting means for demanding and receiving said designated data from said electronic control system;

said display means responsive to output signals of said retrieving means and said communication means for displaying said designated data together with said at least one of said abbreviation and said units, so as to easily identify said designated data without looking up its identification in a manual.

2. The diagnosis system according to claim 1, further comprising data calculator means for converting said designated data received by said communication means in binary to decimal form, and said display means is connected to said data calculator means for displaying said designated data in decimal form.

3. The diagnosis system according to claim 1, wherein said retrieving means includes table data retrieval means and abbreviation data storing means, said table data retrieval means being connected to said interpreting means and said abbreviation data storing means, the latter storing abbreviations and units of check items.

4. The diagnosis system according to claim 1, wherein said retrieving means retrieves both the abbreviation and units corresponding to said designated data and said display means displays both the abbreviation and units corresponding to said designated data along with said designated data.

* * * * *